United States Patent [19]

Friebel et al.

[11] 4,208,629

[45] Jun. 17, 1980

[54] STATIC ELECTRICITY INDICATOR

[75] Inventors: Virgil R. Friebel, Longmont; Kent G. Roller; Jack L. Deitrick, both of Boulder, all of Colo.

[73] Assignee: Ball Corporation, Muncie, Ind.

[21] Appl. No.: 904,102

[22] Filed: May 8, 1978

[51] Int. Cl.² ............................................. G01R 5/28
[52] U.S. Cl. ...................................... 324/457; 46/233
[58] Field of Search .................. 324/32, 33, 109, 133, 324/72; 340/764, 787, 788, 783, 378.1, 378.2; 46/233

[56] References Cited

U.S. PATENT DOCUMENTS 3,955,630  5/1976  Thomas ................................. 46/233

OTHER PUBLICATIONS

Joseph Alexander et al., A Sourcebook for the Physical Sciences, Harcourt, Brace & World, Inc., New York, 1961, p. 504, FIG. 21-10.
M. Riaz, Electrical Engineering Laboratory Manual, McGraw-Hill Co. 1966, pp. 21.1-21.6, see use of ping-pong balls part 5 of Exp. 21.
Allan S. Kullen et al., Webster's New American Dictionary, p. 737, definition of ping-pong.

Primary Examiner—Michael J. Tokar
Attorney, Agent, or Firm—Gilbert E. Alberding

[57] ABSTRACT

The subject invention relates to an indicator device sensitive to small as well as high concentrations of electrostatic charges, the indicator comprising a transparent housing composed of an electrically insulating material and a plurality of articles confined within said housing, said articles having a thin metallic surface such as silver coated upon a low density core.

1 Claim, 3 Drawing Figures

STATIC ELECTRICITY INDICATOR

BACKGROUND OF THE INVENTION

The present invention relates to a device for detecting areas of electrostatic density and more particularly to surfaces having degrees of electrostatic density thereon.

DESCRIPTION OF THE PRIOR ART

Static detectors may be conveniently divided into two types, mainly those that measure the electrostatic field and variations therein and those that determine or detect spark discharges. The latter type generally employ a capacitive antenna of various configurations. The former static detectors range generally from simple devices such as a gold-leaf electroscope or neon lamps to rather sophisticated electrostatic voltmeters, electrometers and field mills.

An early method for observing static electrification consists of rubbing two surfaces or bringing them into direct contact with each other, thereafter separating these surfaces and advancing one of the surfaces having an insulating handle into a Faraday cage connected to an electrostatic potential indicating device. In general, this method employed a gold-leaf electroscope or for lower potentials an electrometer. If the charged body was a conductor with an insulating handle then contact of the surface with the cage and subsequent removal was indicated.

This invention relates to electrostatic apparatus and methods of the kind in which the attraction between members having an electrical potential difference produces a relative movement of a member, thereby indicating the existence of the difference of potential.

There are many problems and hazards due to the static electrification and include collection of particles including powders or dusts on sundry surfaces such as fabrics, containers, carpets, plastic articles and the like as well as handling problems of sundry volatile liquids and gases. It is imperative in these fields that there be simple devices to determine the existence of an electrostatic field.

U.S. Pat. No. 1,042,440 to Hubbard discloses an electrostatic voltmeter for measuring large potentials using the gold-leaf electroscope. Further, U.S. Pat. No. 1,790,540 to Hacklander discloses a simple electroscopic testing device for conductivity of textiles and other articles with a view to determine their degree of purity. Further, U.S. Pat. No. 1,815,606 to Barton discloses a conventional type of electroscope except for the pivotal action of an indicating element. Moreover, U.S. Pat. No. 3,778,927 to Edden relates to a toy or amusement device wherein objects made of insulating material are encased within a transparent chamber. In effect, when the transparent chamber is itself physically rubbed, electrostatic charges are set up within the Edden device which then cause the insulating bodies to separate one from the other and take on an amusing display configuration.

It is an object of this invention to provide an article of manufacture and a method for detecting the presence of static electrification.

Another object of this invention is to provide a cage device having at least one free-flowing member therein, the member having electrically conductive surfaces thereon.

Another principal object of this invention is to provide means for detecting an electrostatic concentration accumulated on various substrates.

Another object of this invention is to provide an article for indicating the presence of static potential in a qualitative manner.

These together with other objects and advantages which will become subsequently apparent reside in the details of construction and operation as more fully hereinafter described and claimed.

DETAILED DESCRIPTION

In accordance with the several aspects of this invention, the subject static electrification device comprises a plurality of articles having a low density core surrounded by a conductive surface layer and a container for enclosing said plurality of articles therein, said container having a transparent viewing portion for said articles. In particular, the subject invention comprises an enclosure means containing a plurality of lightweight articles composed of an insulating material that have been treated with a thin film of a conductive material. Although a number of conductive materials may be employed for the articles it has been found that metallic coatings are preferred including silver, iron, copper, aluminum, nickel and alloys thereof.

Figure 1:
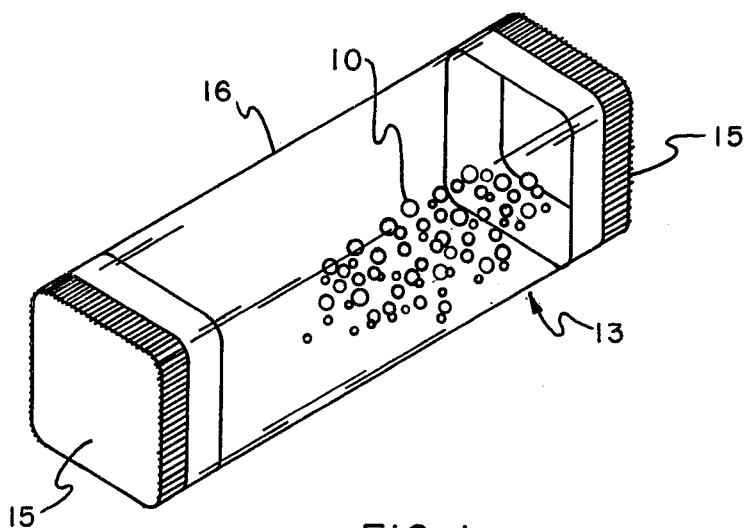
FIG. 1 is an elevated view showing a container body having therein a multiplicity of members in accordance with this invention.
Figure 2:
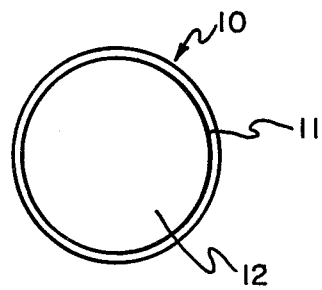
FIG. 2 is a cross-sectional illustration showing a single member with a coating thereon.
Figure 3:
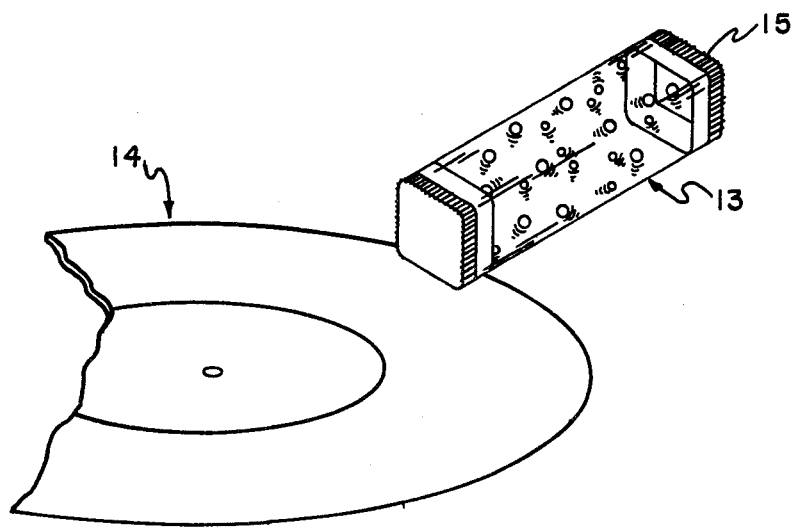
FIG. 3 is a fragmentary illustration showing the subject electrostatic device when brought into close proximity to an electrostatic field, viz., a phonograph record.

Reference herein will be made to all the Figures. and with particular reference to FIG. 1 the housing, which is a conventional transparent container, is denoted by numeral 16, the same being provided with ends 15 to seal the housing. Within the housing 16 are a plurality of coated articles designated as 10. FIG. 2 illustrates a cross-sectional view of the article 10, a bead having a core of a low density material 12 and a thin outer coating 11 thereover of a conductive coating, the function of said coating being more fully disclosed hereinafter.

The housing material for the articles may be of any non-conductive material. In general, any vitreous or plastic material may be employed. This material used may be a variety of substances, but transparent plastic including polystyrene, cellulose acetate and propionate are preferred. Glass is also suitable for such housing materials. The housing should be one that has suitable sealing means to fully close the device. Hermetically sealing the housing to encase the articles is a preferred arrangement. Of course, residual moisture may be readily removed by employing or incorporating a desiccant within the housing, suitably located so that it will not interfere with the free-flowing properties of the articles.

The application of a conductive coating to the core material may be readily accomplished by various means including immersion, spraying, brushing, rolling calendering or via absorbent applicators and the like. Further, electroless coating methods may be advantageiously used as well as vacuum deposition of the coating substance. In general, all that is necessary is a flash of conductive coating, e.g., for silver ca $1 \times 10^{-6}$ to $20 \times 10^{-6}$ inch.

The shape of the articles may be in various forms including spheres, ellipsoids, granules, beads, balls, flakes, crescent, elongated and vermicular. A preferred shape is the sphere or bead. In general, shapes of about 1/32 inch to ⅛ inch are preferred.

The article should be lightweight, that is they should be of low density, a density of about 0.1 lb/cu ft to about 4 lb/cu ft may be employed. Preferably, a density of approximately 1.0 lb/cu ft is preferred.

Plastic and non-plastic materials for the low density portion of the articles may be readily utilized in the subject invention, cellular polystyrene plastic being most suitable. Polystyrene of the preferred type is made by inflating cells of the plastic substance with air resulting in a non-permeable, multi-cellular mass. In general, about 97% air by volume for polystyrene plastic has been found to be suitable for such lightweight plastics.

Although cellular polystyrene is preferred other cellular plastics may be readily used. Cellular plastics are defined as plastic materials that have an apparent density that is decreased substantially by the presence of numerous cells disposed throughout its mass. Generally, the cells or voids may be interconnected in a manner such that gas may pass from one to another (open-celled) or where there is no interconnection, each cell being discrete from the other (closed-cell). Sponge rubber and expanded rubber are also included as cellular plastics.

Suitable cellular plastics for the non-conducting articles include polystyrene, polyurethane, polyethylene, silicones, cellular acrylonitrile-butadiene-styrene, epoxy resin, polyvinyl chloride, urea-formaldehyde resin, phenolformaldehyde resin, cellulose acetate, cellular rubber, cellular ebonite and latex foam rubber.

It is observed that when a surface having an electrostatic charge is moved in the proximity to the subject device the articles therein appear to float in air against gravity, dancing wildly in the container. It is hypothesized that the coating of conductive material on the articles allows or permits the induced electrostatic charges to be distributed thereon and the charges to be readily transferred from one article to the other such that the electrostatic charge on a given article is in a state of change when subjected to a static (i.e., constant) electrostatic field. This assumption is made in light of the apparent wild dancing of the articles when passed through the presence of seemingly a relatively constant electrostatic field.

The degree of activity of the articles apparently indicates in a qualitative as well as quantitative way the concentration of charge in a given field. As known, a number of devices are generally available to indicate levels of electrostatic activity. While some are only active when the device is measuring high concentration of charge, the subject device apparently is sensitive to small as well as high concentration of static electricity.

As previously indicated many problems and hazards are created by accumulations of low as well as high amounts of static charge. Means to detect these concentrations are important. Thus, many uses in different fields of technology may be found for the subject device. In particular, the existence of a static electric charge on the surface of audio elements may now be demonstrated. Generally, noise results from dust particles accumulating due to static charge upon and within the grooves of a phonograph record. The static electricity itself being readily accumulated upon a record by various means such as withdrawing the record from its jacket, sliding the record over a surface or merely handling it. Now with the subject invention such accumulations of charges may be determined.

Phonograph records acquire very high static charges, the surface resistivity of these usually measure more than $10^3$ ohms. Again, these high charges attract particles of various kinds including air-borne as well as non air-borne particles. Because of the charges such particles cling tenaciously and often conventional cleaning cannot remove them from within the grooves of a phonograph record. Audio noises are often associated with groove defects resulting from the attracted particles being actually ground into the plastic grooves upon playing. Air ionization devices have been used to reduce static charge on a record. Materials like polonium have been used to neutralize the static charge so that after radiation from such a source the dust and lint particles may be readily brushed from the playing surface. A number of chemicals have been also recently employed. Heretofore, it has been difficult to determine in a simple and straightforward fashion whether there has been reduction or elimination of static charges from the record surface. The subject device allows this determination.

It is believed that a careful consideration of the specification in conjunction with the means of the drawing will enable the reader to obtain a clear and comprehensive understanding of the subject matter of the invention, the features and advantages, mode of use and improved results which are assured the user.

We claim:

1. An electrostatic indicator for detecting a region of electrostatic density comprising free-flowing members having core portions of non-conductive material of about 1.0 lb/cu ft and a thin conductive layer surrounding said positions, said layer being about $1 \times 10^{-6}$ to about $20 \times 10^{-6}$ inch in thickness, said metal conductive layer being selected from a group consisting of iron, silver copper, aluminum, nickel and alloys thereof, and a transparent housing composed of an electrically insulating material to confine said free-flowing members therein.

* * * * *